United States Patent
Yu

(10) Patent No.: US 10,367,634 B1
(45) Date of Patent: Jul. 30, 2019

(54) CLOCK AND DATA RECOVERY DEVICE AND PHASE CONTROL METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventor: Po-Shing Yu, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/137,500

(22) Filed: Sep. 20, 2018

(30) Foreign Application Priority Data

Jun. 14, 2018  (TW) .............................. 107120572 A

(51) Int. Cl.
| H04L 25/03 | (2006.01) |
| H04L 7/00 | (2006.01) |
| H03L 7/08 | (2006.01) |
| H03L 7/091 | (2006.01) |

(52) U.S. Cl.
CPC .......... *H04L 7/0016* (2013.01); *H03L 7/0807* (2013.01); *H03L 7/091* (2013.01); *H04L 25/03057* (2013.01)

(58) Field of Classification Search
USPC .......................... 375/354, 371, 376; 327/149
See application file for complete search history.

(56) References Cited

U.S. PATENT DOCUMENTS

| 6,927,611 | B2* | 8/2005 | Rhee | H03L 7/0814 327/149 |
| 7,760,116 | B2 | 7/2010 | Liu et al. | |
| 7,961,830 | B2 | 6/2011 | Okamura et al. | |
| 2002/0009170 | A1* | 1/2002 | Schmatz | H03L 7/07 375/371 |
| 2011/0255643 | A1* | 10/2011 | Fu | H03L 7/0807 375/371 |
| 2017/0237550 | A1* | 8/2017 | Shin | H03L 7/081 375/376 |
| 2018/0183633 | A1* | 6/2018 | Ho | H04L 7/033 |

FOREIGN PATENT DOCUMENTS

| TW | 201541922 A | 11/2015 |
| TW | 201724798 A | 7/2017 |

\* cited by examiner

*Primary Examiner* — Eva Y Puente
(74) *Attorney, Agent, or Firm* — CKC & Partners Co., LLC

(57) ABSTRACT

A clock and data recovery device includes a data analysis circuitry, a loop filter circuitry, a phase rotator circuitry, a multiplexer circuitry, and a phase interpolator circuitry. The data analysis circuitry analyzes input data according to a first clock signal and a second clock signal to generate an error signal. The loop filter circuitry updates an adjustment signal according to the error signal. The phase rotator circuitry adjusts rotation signals according to the adjustment signal and limit values if the adjustment signal is updated. The multiplexer circuitry outputs one of the rotation signals as a phase control signal according to third clock signals. The phase interpolator circuitry adjusts the first and the second clock signals according to the phase control signal and fourth clock signals.

10 Claims, 4 Drawing Sheets

CLOCK AND DATA RECOVERY DEVICE AND PHASE CONTROL METHOD

RELATED APPLICATIONS

This application claims priority to Taiwanese Application Serial Number 107120572, filed Jun. 14, 2018, which is herein incorporated by reference in its entirety.

BACKGROUND

Technical Field

The present disclosure relates to a clock and data recovery device. More particularly, the present disclosure relates to a clock and data recovery device and a phase control method thereof applied to high-speed applications.

Description of Related Art

Due to rapid devolvement of technology manufacturing, the operating speed of integrated circuit (IC) has been improved. In a high-speed communication system, a clock and data recovery (CDR) circuit is employed to keep transmitted input data being read correctly. With the increasing in bandwidth, internal circuits in a CDR circuit are required to operate at higher speed and to provide wider phase adjustment range, in order to meet the current requirement. However, with the increasing in requirements of the operating speed, the implementations of the internal circuits in the CDR circuit become difficult.

SUMMARY

Some aspects of the present disclosure are to provide a clock and data recovery (CDR) device that includes a data analysis circuitry, a loop filter circuitry, a phase rotator circuitry, a multiplexer circuitry, and a phase interpolator circuitry. The data analysis circuitry analyzes input data according to a first clock signal and a second clock signal to generate an error signal. The loop filter circuitry updates an adjustment signal according to the error signal. The phase rotator circuitry adjusts rotation signals according to the adjustment signal and limit values if the adjustment signal is updated, in which the plurality of limit values correspond to different phase intervals respectively. The multiplexer circuitry outputs one of the rotation signals as a phase control signal according to third clock signals. The phase interpolator circuitry adjusts the first and the second clock signals according to the phase control signal and fourth clock signals, in which phases of the plurality of third clock signals are different, and phases of the plurality of fourth clock signals are different.

Some aspects of the present disclosure are to provide a phase control method that includes the following operations: analyzing input data according to a first clock signal and a second clock signal to generate an error signal; updating an adjustment signal according to the error signal; adjusting, by a plurality of counter circuits, a plurality of rotation signals according the adjustment signal and a plurality of limit values if the adjustment signal is updated, in which the plurality of limit values correspond to different phase intervals respectively; outputting one of the plurality of rotation signals as a phase control signal according to a plurality of third clock signals; and adjusting the first clock signal and the second clock signal according to the phase control signal and a plurality of fourth clock signals, in which phases of the plurality of third clock signals are different, and phases of the plurality of fourth clock signals are different.

As described above, the CDR device and the phase control method thereof of the present disclosure are able to employ the phase rotator operating in lower frequency to control the phase interpolator circuitry to generate a clock signal having higher frequency. As a result, practical circuit requirements can be reduced, and the phase interpolator circuitry is able to update the phase, step by step, to an expected phase interval to prevent the clock signal from impacts of spikes. Moreover, the phase control method of the present disclosure can provide wider phase control range by setting related circuit configurations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
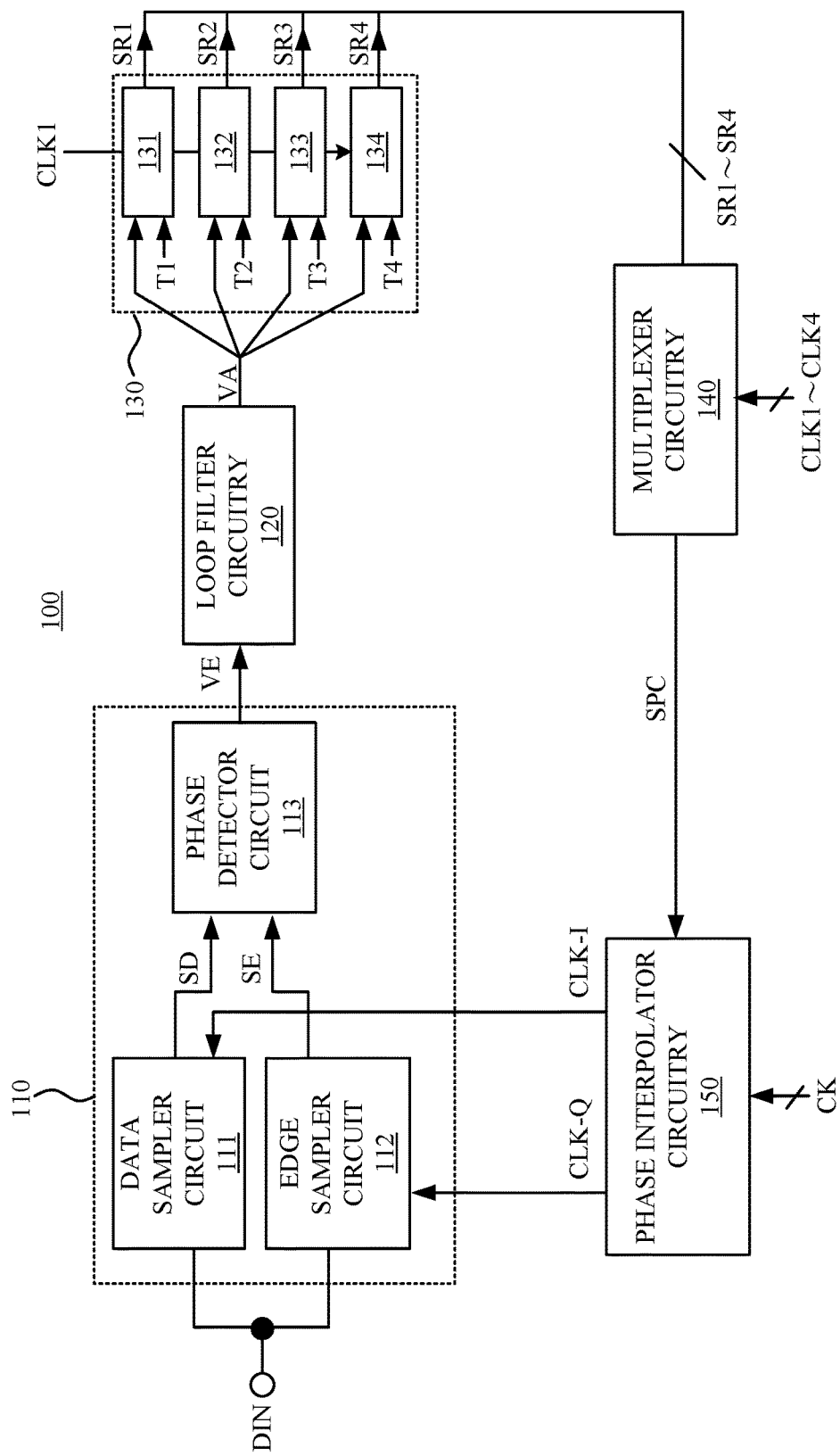
FIG. 1 is a schematic diagram of a clock and data recovery (CDR) device, according to some embodiments of the present disclosure.

Reference is now made to FIG. 1. FIG. 1 is a schematic diagram of a clock and data recovery (CDR) device 100, according to some embodiments of the present disclosure. In some embodiments, the CDR device 100 may be applied to a transceiver employing protocol(s) of peripheral component interconnect express (PCI-E), but the present disclosure is not limited thereto.

In some embodiments, the CDR device 100 includes a data analysis circuitry 110, a loop filter circuitry 120, a phase rotator circuitry 130, a multiplexer circuitry 140, and a phase interpolator circuitry 150. The data analysis circuitry 110 is configured to analyze input data DIN according to a clock signal CLK-I and a clock signal CLK-Q, in order to generate an error signal VE.

In some embodiments, the data analysis circuitry 110 includes a data sampler circuit 111, an edge sampler circuit 112, and a phase detector circuit 113. The data sampler circuit 111 is configured to sample a data value of the input data DIN according to the clock signal CLK-I, in order to generate a data signal SD. The edge sampler circuit 112 is configured to sample a rising edge or a falling edge of the input data DIN, in order to generate an edge signal SE. In some embodiments, the clock signals CLK-I and CLK-Q are different in phase by about 90 degrees.

The phase detector circuit 113 is coupled to the data sampler circuit 111 and the edge sampler circuit 112, in order to receive the data signal SD and the edge signal SE respectively. In some embodiments, the phase detector circuit 113 is configured to compare a phase difference between the data signal SD and the edge signal SE, in order to generate an error signal VE. The phase detector circuit 113 may be implemented with various phase detectors. For example, in different embodiments, the phase detector circuit 113 may be a Hogge phase detector, a Bang-Bang phase detector, an Alexander phase detector, etc, but the present disclose is not limited thereto.

The loop filter circuitry 120 is coupled to the data analysis circuitry 110, in order to receive the error signal VE. In some embodiments, the loop filter circuitry 120 is configured to update the adjustment signal VA according to the error signal VE, and to output the adjustment signal VA to the phase rotator circuitry 130.

In some embodiments, the loop filter circuitry 120 includes a proportional channel (not shown), an integration channel (not shown), and an accumulator. The proportional channel is for determining a phase error between the clock signals CLK-I and CLK-Q according to the error signal VE. The integration channel is for determining a frequency error between the clock signals CLK-I and CLK-Q according to the error signal VE. The accumulator is coupled to the proportional channel and the integration channel, in order to update the adjustment signal VA according to the phase error and the frequency error. In some embodiments, the proportional channel is implemented with elements including, for example, an amplifier circuit and/or a multiplier circuit. In some embodiments, the integration channel is implemented with elements including, for example, an amplifier circuit and/or an at least second-order integrator. The implementations of the loop filter circuitry 120 are given for illustrative purposes, and various types of the loop filter circuitry 120 are within the contemplated scope of the present disclosure.

Figure 3:
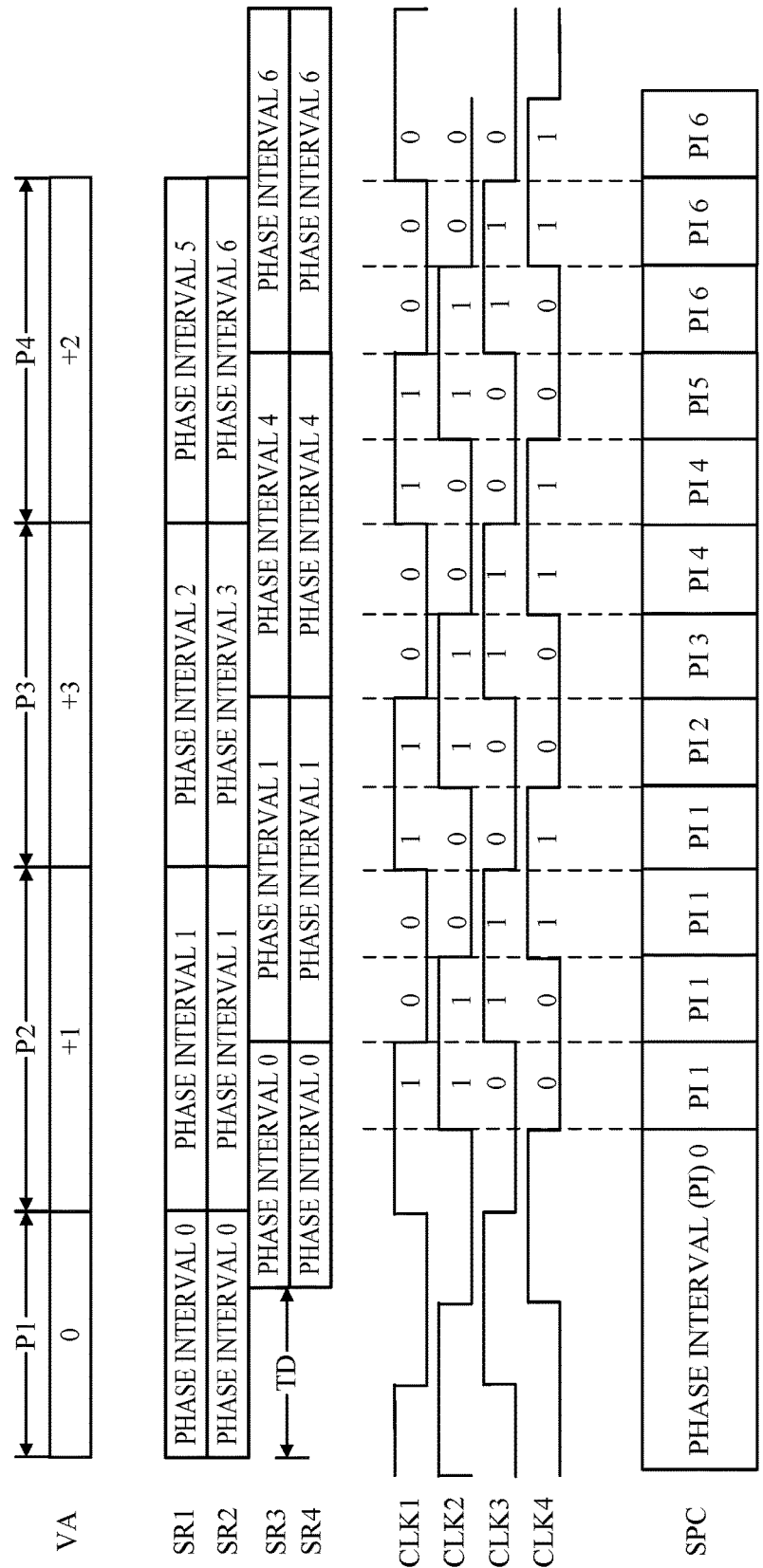
FIG. 3 is a waveform diagram illustrating signals in FIG. 1 according to some embodiments of the present disclosure.

The phase rotator circuitry 130 is coupled to the loop filter circuitry 120, in order to receive the adjustment signal VA. In some embodiments, the phase rotator circuitry 130 is configured to adjust rotation signals SR1-SR4 according to the adjustment signal VA and limit values T1-T4 when the adjustment signal VA is updated. In some embodiments, the rotation signals SR1-SR4 correspond to phase intervals (as shown in FIG. 3 below) respectively.

In some embodiments, the value of the adjustment signal VA indicates how many phase intervals should be adjusted for the phases of the clock signals CLK-I and CLK-Q. In some embodiments, the value of the adjustment signal VA is set between −4 to +4, but the present disclosure is not limited thereto. For example, if the adjustment signal VA has a signal value of +1, it indicates that the phases of the clock signals CLK-I and CLK-Q should be increased by one phase interval. Alternatively, if the adjustment signal VA has a signal value of −1, it indicates that the phases of the clock signals CLK-I and CLK-Q should be decreased by one phase interval. The phase rotator circuitry 130 may adjust the rotation signals SR1-SR4 based on the adjustment signal VA and the limit values T1-T4, in order to adjust the clock signals CLK-I and CLK-Q to an expected phase interval.

In some embodiments, the phase rotator circuitry 130 includes counter circuits 131-134. Each of the counter circuits 131-134 outputs a corresponding one of the rotation signals SR1-SR4 according to the adjustment signal VA and a corresponding one of the limit values T1-T4. For example, the counter circuit 131 outputs the rotation signal SR1 according to the limit value T1 and the adjustment signal VA. The counter circuit 132 outputs the rotation signal SR2 according to the limit value T2 and the adjustment signal VA. With this analogy, the corresponding relations among the counter circuits 131-134, the limit values T1-T4, and the rotation signal SR1-SR4 can be understood. The operations of the counter circuits 131-134 will be given with reference to FIGS. 2 and 3 below.

The multiplexer circuitry 140 is coupled to the phase rotator circuitry 130, in order to receive the rotation signals SR1-SR4. In some embodiments, the multiplexer circuitry 140 outputs one of the rotations signals SR1-SR4 as a phase control signal SPC according to clock signals CLK1-CLK4 (as shown in FIG. 3 below). The clock signals CLK1-CLK4 have the same frequency but have different phases. For example, as shown in FIG. 3 below, two successive signals in the clock signals CLK1-CLK4 are different in phase by about 90 degrees.

The phase interpolator circuitry 150 is coupled to the multiplexer circuitry 140 to receive the phase control signal SPC. In some embodiments, the phase interpolator circuitry 150 adjusts the phases of the clock signals CLK-I and CLK-Q according to the phase control signal SPC and clock signals CK, in which phases of the clock signals are different from each other, and the frequency of the clock signals CLK1-CLK4 is lower than the frequency of the clock signals CK. Alternatively, in some embodiments, the multiplexer circuitry 140 may include two multiplexer circuits (not shown). One multiplexer circuit outputs the phase control signal SPC for adjusting the clock signal CLK-I, and the phase interpolator circuitry 150 is able to adjust the phase of the clock signal CLK-I according to this phase control signal SPC and the clock signals CK. The other one multiplexer circuit outputs the other one phase control signal SPC for adjusting the clock signal CLK-Q, and the phase interpolator circuitry 150 is able to adjust the phase of the clock signal CLK-Q according to the other phase control signal SPC and the clock signals CK.

In some embodiments, the phase interpolator circuitry 150 includes input pairs (not shown) and a current source circuit (not shown). The input pairs are coupled to the current source circuit, and are selectively turned on according to the clock signals CK. The current source circuit includes switches that are selectively turned on according to the phase control signal SPC to determine a current ratio associated with the input pairs. Accordingly, the input pairs may interpolate the expected clock signals CLK-I and CLK-Q from the clock signals CK according to this current ratio. The arrangements for the phase interpolator circuitry 150 are given for illustrative purpose, and various arrangements for the phase interpolator circuitry 150 are within the contemplated scope of the present disclosure.

Figure 2:
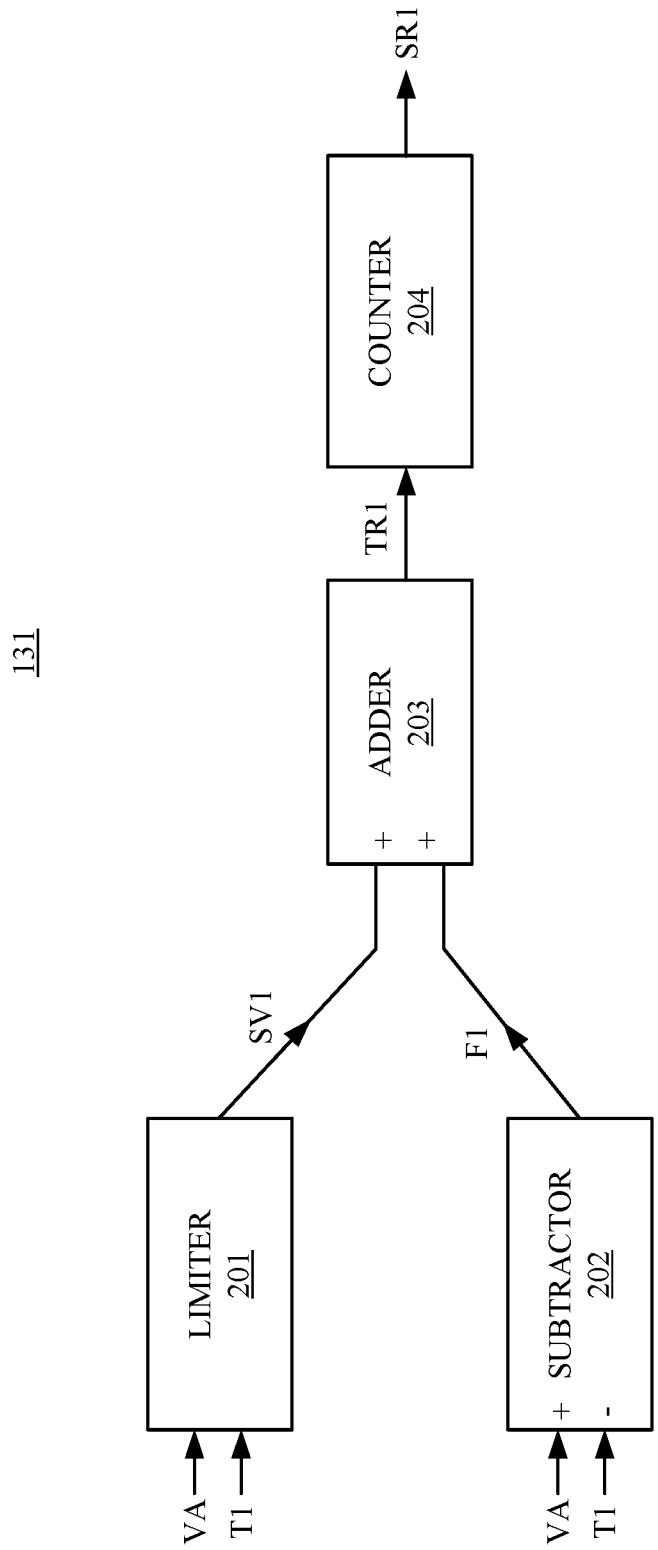
FIG. 2 is a schematic diagram of the counter circuit in FIG. 1, according to some embodiments of the present disclosure.

Reference is now made to FIG. 2. FIG. 2 is a schematic diagram of the counter circuit 131 in FIG. 1, according to some embodiments of the present disclosure. For ease of understanding, like elements in FIG. 2 are designated with the same reference numbers with respect to FIG. 1.

As shown in FIG. 2, in some embodiments, the counter circuit 131 is configured to adjust the rotation signal SR1 according to the limit value T1 and a feedback signal value F1. In some embodiments, the feedback value F1 is a difference between a previous signal value of the adjustment signal VA and the limit value T1.

In greater detail, in some embodiments, the counter circuit 131 includes a limiter 201, a subtractor 202, an adder 203, and a counter 204. The limiter 201 is configured to compare the limit value T1 and the adjustment signal VA, in order to output a signal value SV1. If a current signal value of the adjustment signal VA is less than or equal to the limit value T1, the limiter 201 outputs the current signal value of the adjustment signal VA as the signal value SV1. Alternatively, if the current signal value of the adjustment signal VA is greater than the limit value T1, the limiter 201 outputs the limit value T1 as the signal value SV1. The subtractor 202 is configured to subtract the limit value T1 from the previous signal value of the adjustment signal VA if the previous signal value of the adjustment signal VA is greater than the limit value T1, in order to generate the feedback signal value F1. The adder 203 is coupled to the limiter 201 and the subtractor 202, in order to receive the feedback value F1 and the signal value SV1. The adder 203 is configured to sum up the feedback signal value F1 and the signal value SV1, in order to generate a trigger signal TR1. The counter 204 is coupled to the adder 203 to receive the trigger signal TR1. The counter 204 is able to perform one or more counting operations according to the trigger signal TR1, in order to generate the rotation signal SR1. For example, in the beginning, the signal value of the rotation SR1 (e.g., 0000) may correspond to "phase interval 0." When the trigger signal TR1 has a value of +1, the counter 204 performs one counting operation to increase the signal value of the rotation signal SR1 by one (i.e., 0000 is increased to 0001), in order to correspond to "phase interval 1." With this analogy, if the next trigger signal TR1 has a value of +3, the counter 204 performs three counting operations to increase the signal value of the rotation signal SR1 by three (i.e., 0001 is increased to 0100), in order to correspond to "phase interval 4." In some embodiments, the limiter 201 may include a comparator. In some embodiments, the subtractor 202 and/or the adder 203 may include a processing circuit that is implemented with one or more digital circuits. In some embodiments, the counter 204 may be implemented with an up counter circuit or a down counter circuit. In some embodiments, the limiter 201, the subtractor 202, and the adder 203 may operate according to the clock signal CLK1. In some embodiments, the counter circuit 131 may further include a register (not shown) that is configured to store the previous signal value of the adjustment signal VA or the operation result of the subtractor 202.

The arrangements of other counter circuits 132-134 are the same as the counter circuit 131 in FIG. 2. Taking the counter circuit 132 as an example, the above arrangement may be employed with replacing the limit value T1 to the limit value T2, in order to generate the rotation signal SR2. With this analogy, the implementations of the all counter circuits 131-134 can be understood, and thus the repetitious descriptions are not further given. The circuit arrangements of the counter circuit 131 are given for illustrative purposes, and other arrangements to perform the same functions are within the contemplated scope of the present disclosure.

Reference is now made to FIG. 3. FIG. 3 is a waveform diagram illustrating signals in FIG. 1 according to some embodiments of the present disclosure. In some embodiments, the counter circuits 131-134 operate according to the clock signal CLK1. In other words, during each period (e.g., periods P1-P4) of the clock signal CLK1, if the adjustment signal VA is updated, the counter circuits 131-134 adjust the rotation signal SR1-SR4 to corresponding phase intervals.

In some embodiments, the counter circuits 133-134 are configured to output the rotation signals SR3-SR4 after a predetermined time TD. With the predetermined time TD, it is assured that the multiplexer circuitry 140 outputs a value in the middle of the pulse width of a selected one of the rotation signals SR1-SR4 as the phase control signal SPC. The above time interval of the predetermined time TD may range from 0 to any value, and may be adjusted according to practical requirements. In some embodiments, the limit values T1-T4 may be 1, 2, 3, and 4, respectively, but the present disclosure is not limited thereto.

As shown in FIG. 3, in the period P1, the adjustment signal VA has a signal value of +0. As the current signal value (+0) of the adjustment signal VA is less than all limit values T1-T4, the limiters (e.g., the limiter 201) of the counter circuits 131-134 output the current signal value (+0) of the adjustment signal VA as the signal value (e.g., the signal value SV1). As the adjustment signal VA did not have the previous signal value, the subtractors (e.g., the subtractor 202) of the counter circuits 131-134 do not generate the feedback signal value F1. As a result, the adders (e.g., the adder 203) of the counter circuits 131-134 output the trigger signals TR1 having a signal value of 0. Accordingly, the counters (e.g., the counter 204) of the counter circuits 131-134 do not perform the counting operations, in order to generate the phase control signal SPC having a signal value corresponding to "phase interval 0."

In the period P2, the current signal value of the adjustment signal VA is updated to a signal value of +1. As the current signal value (+1) of the adjustment signal VA is less than or equal to the limit values T1-T4. The limiters (e.g., the limiter 201) of the counter circuits 131-134 output the current signal value (+1) of the adjustment signal VA as the signal value (e.g., the signal value SV1). Moreover, as the previous signal value (+0) of the adjustment signal VA is not greater than the limit values T1-T4, the subtractors (e.g., the subtractor 202) of the counter circuits 131-134 do not generate the feedback signal value F1. As a result, the adders (e.g., the adder 203) of the counter circuits 131-134 output the trigger signals TR1 having a signal value of 1. Accordingly, the counters (e.g., the counter 204) of the counter circuits 131-134 perform one counting operation, in order to update the signal values of the rotation signals SR1-SR4 to signal values corresponding to "phase interval 1."

Accordingly, in the period P2, if the data values of the clock signals are "1100" in sequence, the multiplexer circuitry 140 outputs the rotation signal SR1 as the phase control signal SPC. If the data values of the clock signals are "0110" in sequence, the multiplexer circuitry 140 outputs the rotation signal SR2 as the phase control signal SPC. If the data values of the clock signals are "0011" in sequence, the multiplexer circuitry 140 outputs the rotation signal SR3 as the phase control signal SPC. As a result, at the end of the period P2, the multiplexer circuitry 140 outputs the phase control signal SPC having a signal value corresponding to "phase interval 1."

In the period P3, the current signal value of the adjustment signal VA is updated to a signal value of +3. As the current signal value (+3) of the adjustment signal VA is less than or equal to the limit values T3-T4, the limiters (e.g., the limiter 201) of the counter circuits 133-134 output the current signal value (+3) of the adjustment signal VA as the signal value (e.g., the signal value SV1). Moreover, as the previous signal value (+1) of the adjustment signal VA is not greater than the limit values T3-T4, the subtractors (e.g., the subtractor 202) of the counter circuits 133-134 do not generate the feedback signal value F1. As a result, the adders (e.g., the adder 203) of the counter circuits 133-134 output the trigger signals TR1 having a signal value of +3. Accordingly, the counters (e.g., the counter 204) of the counter circuits 133-134 perform three counting operations, such that the signal values of the rotation signals SR3-SR4 are updated from the signal values corresponding to "phase interval 1" to signal values corresponding to "phase interval 4."

In addition, as the current signal value (+3) of the adjustment signal VA is greater than the limit value T1, the limiter 201 of the counter circuit 131 outputs the limit value T1 as the signal value SV1. As the previous signal value (+1) of the adjustment signal VA is not greater than the limit value T1, the subtractor 202 of the counter circuit 131 do not generate the feedback signal value F1. As a result, the adder 203 of the counter circuit 131 outputs the trigger signal TR1 having a signal value +1 (i.e., the limit value T1). Accordingly, the counter 204 of the counter circuit 131 performs one counting operation, such that the rotation signal SR1 is updated from the signal value corresponding to "phase interval 1" to the signal value corresponding to "phase interval 2."

Similarly, as the current signal value (+3) of the adjustment signal VA is greater than the limit value T2, the limiter (e.g., the limiter 201) of the counter circuit 132 outputs the limit value T2 as the signal value (e.g., the signal value SV1). As the previous signal value (+1) of the adjustment signal VA is not greater than the limit value T2, the subtractor (e.g., the subtractor 202) of the counter circuit 132 do not generate the feedback signal value F1. As a result, the adder of the counter circuit 132 output the trigger signal TR1 having the signal value of +2 (i.e., the limit value T2). Accordingly, the counter (i.e., the counter 204) of the counter circuit 132 performs twice counting operations, such that the rotation signal SR2 is updated from the signal value corresponding to "phase interval 1" to a signal value corresponding to "phase interval 3."

Accordingly, in the period P3, if the data values of the clock signals are "1001" in sequence, the multiplexer circuitry 140 outputs the rotation signal SR4 as the phase control signal SPC. If the data values of the clock signals are "1100" in sequence, the multiplexer circuitry 140 outputs the rotation signal SR1 as the phase control signal SPC. With this analogy, at the end of the period P3, the multiplexer circuitry 140 outputs the phase control signal SPC having a signal value corresponding to "phase interval 4."

In the period P4, the current signal value of the adjustment signal VA is updated to a signal value of +2. As the current signal value (+2) of the adjustment signal VA is less than the limit values T3-T4, the limiters (e.g., the limiter 201) of the counter circuits 133-134 output the current signal value (+2) of the adjustment signal VA as the signal values (e.g., the signal value SV1). As the previous signal value (+3) of the adjustment signal VA is not greater than the limit values T3-T4, the subtractors (e.g., the subtractor 202) of the counter circuits 133-134 do not generate the feedback signal value F1. As a result, the adders (e.g., the adder 203) of the counter circuits 133-134 output the trigger signal TR1 having a signal value of +2. Accordingly, the counters (e.g., the counter 204) of the counter circuits 133-134 perform twice counting operations, such that the signal values of the rotation signals SR3-SR4 are updated from the signal values corresponding to "phase interval 4" to signal values corresponding to "phase interval 6."

In addition, as the previous signal value (+3) of the adjustment signal VA is greater than the limit value T1, the subtractor 202 of the counter circuit 131 generates the feedback signal value F1 having the signal value of +2. As the current signal value (+2) of the adjustment signal VA is greater than the limit value T1, the limiter 201 of the counter circuit 131 outputs the limit value T1 as the signal value SV1. As a result, the adder 203 of the counter circuit 131 outputs the trigger signal TR1 having a signal value of +3. Accordingly, the counter 204 of the counter circuit 131 performs three counting operations, such that the rotation signal SR1 is updated from the signal value corresponding to "phase interval 2" to a signal value corresponding to "phase interval 5."

Similarly, as the previous signal value (+3) of the adjustment signal VA is greater than the limit value T2, the subtractor of the counter circuit 132 generates the feedback signal having the value of +1. As the current signal value (+2) of the adjustment signal VA is less than or equal to the limit value T2, the limiter of the counter circuit 132 outputs the current signal value (+2) of the adjustment signal VA as the signal value (e.g., the signal value SV1). As a result, the adder (e.g., adder 203) of the counter circuit 132 outputs the trigger signal TR1 having the signal value of +3. Accordingly, the counter (e.g., counter 204) of the counter circuit 132 performs three counting operations, such that the rotation signal SR2 is updated from the signal value corresponding to "phase interval 3" to a signal value corresponding to "phase interval 6."

Accordingly, in the period P4, the multiplexer circuitry 140 outputs the phase control signal SPC from the signal value corresponding to "phase interval 4" to the signal value corresponding to "phase interval 6."

In some related approaches, whenever a phase adjustment is needed, the signal value of the phase control signal may be directly adjusted to a signal value corresponding to a required phase interval. In these approaches, in order to correspond to the required phase interval, the signal value of the phase control signal corresponds may be adjusted by excess phase intervals (for example, more than one phase interval) at one operation. As a result, a spike is introduced to the operations of the phase rotator, such that the overall performance of the system is reduced. Moreover, with the increasing of the operational speed, the rotator is required to operate in a higher frequency, such that the implementations of the phase rotator are not easily achieved.

Compared to these approaches, with the phase rotator circuitry 130 and the multiplexer circuitry 140, as shown in FIG. 3, in each period where the adjustment signal VA is updated (i.e., period P1-P4). the signal value of the phase control signal SPC is updated, step by step, to a signal value corresponding to a signal value corresponding to an expected phase interval. As a result, spikes on the clock signals CLK-I and CLK-O are prevented. In some embodiments, the frequency of the clock signal CLK1-CLK4 is about 2 GHz, and the frequency of the clock signal CK is about 8 GHz. As described above, the phase rotator circuitry 130 is able to be implemented with digital circuits operating in lower frequency to control the phase interpolator circuitry 150, in order to generate clock signals having higher frequency. Accordingly, the difficulty of implementing the phase rotator circuitry 130 can be reduced.

It is understood that, the above arrangements, the frequency, and the numbers of the clock signals CLK1-CLK4 are given for illustrative purposes, and the present disclosure is not limited thereto. Base on different applications and design considerations, the arrangements, the frequency, and the numbers of the clock signals CLK1-CLK4 may be adjusted correspondingly. According to the above embodiments, with adjusting the circuit configuration, including, for example, increasing the numbers of the counter circuits 131-134, adjusting the intervals of updating the phase interval, and/or increasing the numbers of the clock signal CLK1-CLK4, the CDR device 100 is able to provide a wider phase control range.

Figure 4:
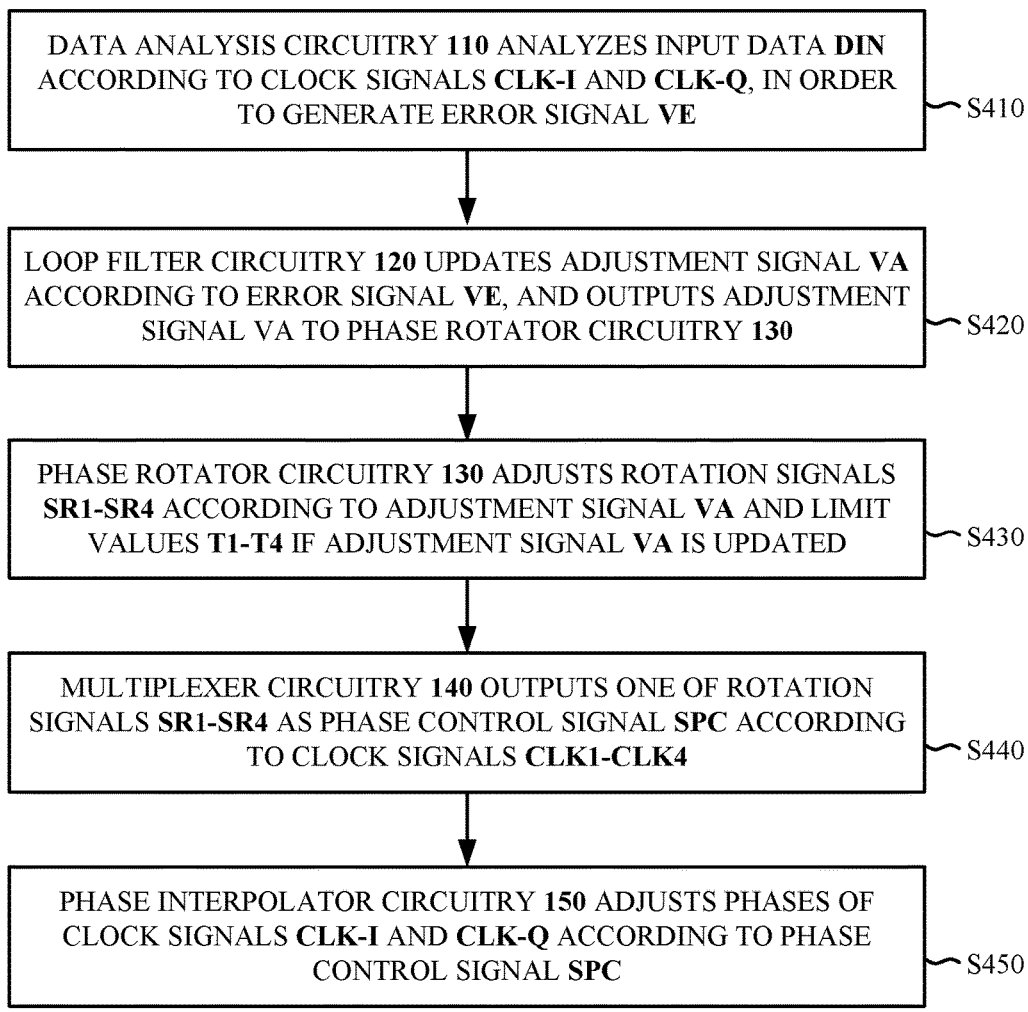
FIG. 4 is a flow chart of a phase control method, according to some embodiments of the present disclosure.

FIG. 4 is a flow chart of a phase control method 400, according to some embodiments of the present disclosure. For ease of understanding, the phase control method 400 is described with reference to the above figures.

In operation S410, the data analysis circuitry 110 analyzes the input data DIN according to the clock signals CLK-I and CLK-Q, in order to generate the error signal VE. For example, as shown in FIG. 1, with the cooperation of the data sampler circuit 111, the edge sampler circuit 112, and the phase detector circuit 113, the error signal VE is generated according to the phase difference between the data signal SD and the edge signal SE.

In operation S420, the loop filter circuitry 120 updates the adjustment signal VA according to the error signal VE, and outputs the adjustment signal VA to the phase rotator circuitry 130. In operation S430, the phase rotator circuitry 130 adjusts the rotation signals SR1-SR4 according to the adjustment signal VA and the limit values T1-T4 if the adjustment signal VA is updated.

For example, as shown in FIGS. 2-3, in the periods P1-P4, the counter circuits 131-134 generates the rotation signals SR1-SR4 corresponding to phase intervals in response to the updated adjustment signal VA.

In operation S440, the multiplexer circuitry 140 outputs one of the rotation signals SR1-SR4 as the phase control signal SPC according to the clock signals CLK1-CLK4. For example, as shown in FIG. 3, in the period P2, the multiplexer circuitry 140 sequentially outputs the rotation signal SR1, SR2, and SR3 as the phase control signal SPC according to the clock signals CLK1-CLK4.

In operation S450, the phase interpolator circuitry 150 adjusts phases of the clock signals CLK-I and CLK-Q according to the phase control signal SPC.

The above description of the phase control method 400 includes exemplary operations, but the operations of the phase control method 400 are not necessarily performed in the order described above. The order of the operations of the phase control method 400 can be changed, or the operations can be executed simultaneously or partially simultaneously as appropriate, in accordance with the spirit and scope of various embodiments of the present disclosure.

As described above, the CDR device and the phase control method thereof of the present disclosure are able to employ the phase rotator operating in lower frequency to control the phase interpolator circuitry to generate a clock signal having higher frequency. As a result, practical circuit requirements can be reduced, and the phase interpolator circuitry is able to update the phase, step by step, to an expected phase interval to prevent the clock signal from impacts of spikes. Moreover, the phase control method of the present disclosure can provide wider phase control range by setting related circuit configurations.

Various functional components or blocks have been described herein. As will be appreciated by persons skilled in the art, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A clock and data recovery device, comprising:
a data analysis circuitry configured to analyze input data according to a first clock signal and a second clock signal to generate an error signal;
a loop filter circuitry configured to update an adjustment signal according to the error signal;
a phase rotator circuitry configured to adjust a plurality of rotation signals according the adjustment signal and a plurality of limit values if the adjustment signal is updated, wherein the plurality of limit values correspond to different phase intervals respectively;
a multiplexer circuitry configured to output one of the plurality of rotation signals as a phase control signal according to a plurality of third clock signals; and
a phase interpolator circuitry configured to adjust the first clock signal and the second clock signal according to the phase control signal and a plurality of fourth clock signals, wherein phases of the plurality of third clock signals are different, and phases of the plurality of fourth clock signals are different.

2. The clock and data recovery device of claim 1, wherein the phase rotator circuitry comprises:
a plurality of counter circuits configured to adjust the plurality of rotation signals according to the adjustment signal and the plurality of limit values, and the plurality of counter circuits comprises:
a first counter circuit configured to adjust a first rotation signal of the plurality of rotation signals according to a first limit value of the plurality of limit values and a previous signal value and a current signal value of the adjustment signal.

3. The clock and data recovery device of claim 2, wherein the first counter circuit comprises:

a limiter configured to compare the first limit value with the current signal value of the adjustment signal, in order to output a first limit value or the current signal value of the adjustment signal as a first signal value;

a subtractor configured to subtract the first limit value from the previous signal value of the adjustment signal to generate a feedback signal value if the previous signal value of the adjustment signal is greater than the first limit value;

an adder configured to sum up the feedback signal value and the first signal value, in order to output a trigger signal; and a counter configured to perform one or more counting operations according to the trigger signal, in order to generate the first rotation signal.

4. The clock and data recovery device of claim 3, wherein if the current signal value of the adjustment signal is less than or equal to the first limit value, the limiter outputs the current signal value of the adjustment signal as the first signal value, and if the current signal value of the adjustment signal is greater than the first limit value, the limiter outputs the first limit value as the first signal value.

5. The clock and data recovery device of claim 1, wherein a frequency of each of the plurality of third clock signals is lower than a frequency of each of the plurality of fourth clock signals.

6. The clock and data recovery device of claim 1, wherein if the adjustment signal is updated, the multiplexer circuitry configured to select the one of the plurality of rotation signals according to the plurality of third clock signals, in order to update, step by step, the phase control signal.

7. A phase control method, comprising:
analyzing input data according to a first clock signal and a second clock signal to generate an error signal;
updating an adjustment signal according to the error signal;
adjusting, by a plurality of counter circuits, a plurality of rotation signals according the adjustment signal and a plurality of limit values if the adjustment signal is updated, wherein the plurality of limit values correspond to different phase intervals respectively;
outputting one of the plurality of rotation signals as a phase control signal according to a plurality of third clock signals; and
adjusting the first clock signal and the second clock signal according to the phase control signal and a plurality of fourth clock signals, wherein phases of the plurality of third clock signals are different, and phases of the plurality of fourth clock signals are different.

8. The phase control method of claim 7, wherein adjusting the plurality of rotation signals comprises:
adjusting, by a first counter circuit of the plurality of counter circuits, a first rotation signal of the plurality of rotation signals according to a first limit value of the plurality of limit values and a previous signal value and a current signal value of the adjustment signal.

9. The phase control method of claim 8, wherein adjusting the first rotation signal comprises:
comparing, by a limiter of the first counter circuit, the first limit value with the current signal value of the adjustment signal, in order to output a first limit value or the current signal value of the adjustment signal as a first signal value;
subtracting, by a subtractor of the first counter circuit, the first limit value from the previous signal value of the adjustment signal to generate a feedback signal value if the previous signal value of the adjustment signal is greater than the first limit value;
summing up, by an adder of the first counter circuit, the feedback signal value and the first signal value, in order to output a trigger signal; and
performing, by a counter of the first counter circuit, one or more counting operations according to the trigger signal, in order to generate the first rotation signal.

10. The phase control method of claim 9, wherein if the current signal value of the adjustment signal is less than or equal to the first limit value, the limiter outputs the current signal value of the adjustment signal as the first signal value, and if the current signal value of the adjustment signal is greater than the first limit value, the limiter outputs the first limit value as the first signal value.

* * * * *